(12) United States Patent
Chang et al.

(10) Patent No.: US 10,581,174 B2
(45) Date of Patent: Mar. 3, 2020

(54) WIRELESS COMMUNICATION DEVICE AND ANTENNA THEREOF

(71) Applicant: Wistron NeWeb Corporation, Hsinchu (TW)

(72) Inventors: Hung-Ming Chang, Hsinchu (TW); Yi-Chieh Lin, Hsinchu (TW); Shih-Hong Chen, Hsinchu (TW)

(73) Assignee: WISTRON NEWEB CORPORATION, Hsinchu (TW)

( * ) Notice: Subject to any disclaimer, the term of this patent is extended or adjusted under 35 U.S.C. 154(b) by 124 days.

(21) Appl. No.: 16/034,652

(22) Filed: Jul. 13, 2018

(65) Prior Publication Data

US 2019/0123449 A1   Apr. 25, 2019

(30) Foreign Application Priority Data

Oct. 19, 2017  (TW) .............................. 106135931 A

(51) Int. Cl.
| | |
|---|---|
| *H01Q 15/14* | (2006.01) |
| *H01Q 21/20* | (2006.01) |
| *H01Q 19/10* | (2006.01) |
| *H01Q 9/28* | (2006.01) |
| *H01Q 1/12* | (2006.01) |
| *H05K 9/00* | (2006.01) |
| *H01Q 15/18* | (2006.01) |

(52) U.S. Cl.
CPC .............. *H01Q 15/14* (2013.01); *H01Q 1/12* (2013.01); *H01Q 9/285* (2013.01); *H01Q 19/106* (2013.01); *H01Q 21/205* (2013.01); *H01Q 15/18* (2013.01); *H05K 9/00* (2013.01)

(58) Field of Classification Search
CPC .......... H01Q 15/14; H01Q 1/12; H01Q 9/285; H01Q 19/106; H01Q 21/205; H01Q 15/18; H01Q 1/1207; H01Q 1/42; H01Q 1/22; H01Q 1/28; H05K 9/00
See application file for complete search history.

(56) References Cited

U.S. PATENT DOCUMENTS

| | | | |
|---|---|---|---|
| 2008/0231519 A1* | 9/2008 | Yang | ........................ H01Q 1/12 343/702 |
| 2010/0045563 A1* | 2/2010 | Thompson | ............. B64G 1/222 343/881 |
| 2018/0151950 A1* | 5/2018 | Hunt | ........................ G06F 1/20 |
| 2018/0337443 A1* | 11/2018 | Bisiules | ................. H01Q 1/246 |

* cited by examiner

*Primary Examiner* — Hai V Tran
*Assistant Examiner* — David E Lotter
(74) *Attorney, Agent, or Firm* — McClure, Qualey & Rodack, LLP

(57) ABSTRACT

An antenna is provided and includes a first antenna structure, a signal reflection structure, and an assembling unit. The first antenna structure has a first positioning portion and a radiator having a free end. The signal reflection structure has a second positioning portion, in which the signal reflection structure is configured to be assembled with the first antenna structure, and the first positioning portion corresponds with the second positioning portion. The assembling unit is for assembling the first antenna structure and the signal reflection structure in conjunction with the first and second positioning portions. The inner edge is configured to abut against the first antenna structure and the signal reflection structure. The receiving groove is located at one of the end portions of the assembling unit, in which the receiving groove is capable of receiving the free end of the radiator in order to limit its movement.

20 Claims, 15 Drawing Sheets

WIRELESS COMMUNICATION DEVICE AND ANTENNA THEREOF

CROSS-REFERENCE TO RELATED APPLICATION

This application claims the priority benefit of Taiwan application serial no. 106135931, which was filed on Oct. 19, 2017.

FIELD OF THE INVENTION

The present invention relates to an antenna, and more particularly to an antenna having components that are properly fixed thereto.

BACKGROUND OF THE INVENTION

Conventionally, a type of antenna includes a first antenna structure, a signal reflection structure, a gain element, a base, and a number of cables, etc. These components are usually assembled by simply mechanically fitting to each other, which consequently causes larger gap between them. For instance, the gap between the first antenna structure and the signal reflection structure will be enlarged, meaning that the structure stabilities will be reduced, and the antenna structure will be susceptible to deformation. As a result, such conventional antenna structures provide poorer performances or may even cause damage after a time period of usage due to the poor structural stability.

Furthermore, conventional gain elements are typically thin metal pieces, which are very easily deformed during manufacture. Deformed gain elements provide poor performance and impact the overall antenna efficiency. Besides, the cables involved in conventional antennas are often disorganized and messy, thereby being difficult to implement the antenna into wireless communication devices.

SUMMARY OF THE INVENTION

In accordance with one embodiment of the present invention, an antenna includes a first antenna structure, a signal reflection structure, and an assembling unit. The first antenna structure has a first positioning portion and a radiator having a free end. The signal reflection structure has a second positioning portion, in which the signal reflection structure is configured to be assembled with the first antenna structure, and the first positioning portion corresponds with the second positioning portion. The assembling unit is for assembling the first antenna structure and the signal reflection structure. The assembling unit has two end portions, in which the assembling unit includes an inner edge, a first clamping part, a fastening part, and a receiving groove. The inner edge is configured to abut against the first antenna structure and the signal reflection structure. The first clamping part is configured to be clamping the first antenna structure and the signal reflection structure for limiting the first antenna structure and the signal reflection structure to move along a first axial direction. The fastening part is configured to fasten the first positioning portion and the second positioning portion for limiting the first antenna structure and the signal reflection structure to move along a second axial direction, in which the fastening part and the inner edge are to limit the movement of the first antenna structure and the signal reflection structure along a third axial direction. The first axial direction, the second axial direction, and the third axial direction are perpendicular to each other. The receiving groove is located at one of the end portions of the assembling unit, in which the receiving groove is capable of receiving the free end of the radiator in order to limit the movement thereof in the third axial direction.

According to another embodiment of the present invention, a wireless communication device is provided and includes a housing, an antenna, and a circuit board. The antenna is located inside the housing and includes a first antenna structure, a signal reflection structure, and an assembling unit. The first antenna structure has a first positioning portion and a radiator having a free end. The signal reflection structure has a second positioning portion, in which the signal reflection structure is configured to be assembled with the first antenna structure, and the first positioning portion corresponds with the second positioning portion. The assembling unit is for assembling the first antenna structure and the signal reflection structure. The assembling unit has two end portions, in which the assembling unit includes an inner edge, a first clamping part, a fastening part, and a receiving groove. The inner edge is configured to abut against the first antenna structure and the signal reflection structure. The first clamping part is configured to be clamping the first antenna structure and the signal reflection structure for limiting the first antenna structure and the signal reflection structure to move along a first axial direction. The fastening part is configured to fasten the first positioning portion and the second positioning portion for limiting the first antenna structure and the signal reflection structure to move along a second axial direction, in which the fastening part and the inner edge are to limit the movement of the first antenna structure and the signal reflection structure along a third axial direction. The first axial direction, the second axial direction, and the third axial direction are perpendicular to each other. The receiving groove is located at one of the end portions of the assembling unit, in which the receiving groove is capable of receiving the free end of the radiator in order to limit the movement thereof in the third axial direction. The circuit board is coupled to the first antenna structure.

BRIEF DESCRIPTION OF THE DRAWINGS

The structure and the technical means adopted by the present invention to achieve the above and other objects can be best understood by referring to the following detailed description of the preferred embodiments and the accompanying drawings.

DETAILED DESCRIPTION OF THE PREFERRED EMBODIMENTS

Figure 1:
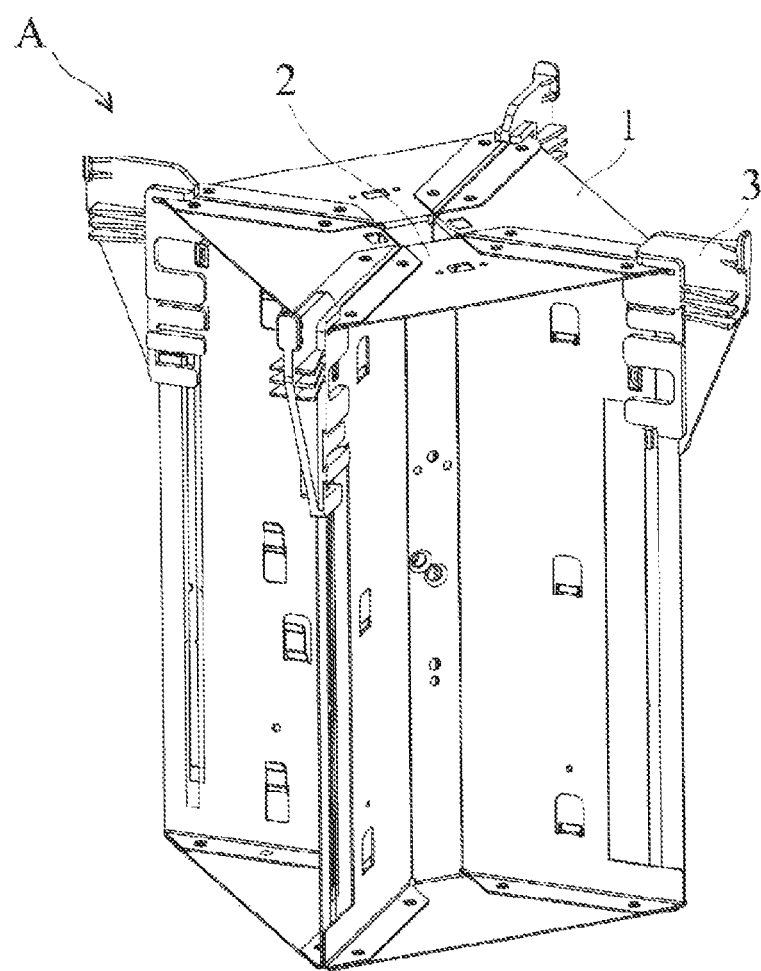
FIG. 1 is a perspective view illustrating a part of an antenna according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts. It is not intended to limit the method or the system by the exemplary embodiments described herein. In the following detailed description, for purposes of explanation, numerous specific details are set forth in order to attain a thorough understanding of the disclosed embodiments. It will be apparent, however, that one or more embodiments may be practiced without these specific details. As used in the description herein and throughout the claims that follow, the meaning of "a", "an", and "the" includes reference to the plural unless the context clearly dictates otherwise. Also, as used in the description herein and throughout the claims that follow, the terms "comprise or comprising", "include or including", "have or having", "contain or containing" and the like are to be understood to be open-ended, i.e., to mean including but not limited to. As used in the description herein and throughout the claims that follow, the meaning of "in" includes "in" and "on" unless the context clearly dictates otherwise.

It will be understood that when an element is referred to as being "connected" to another element, it can be directly connected to the other element or intervening elements may be present, as will be understood by persons skilled in the art from the context of the disclosure.

Figure 2A:
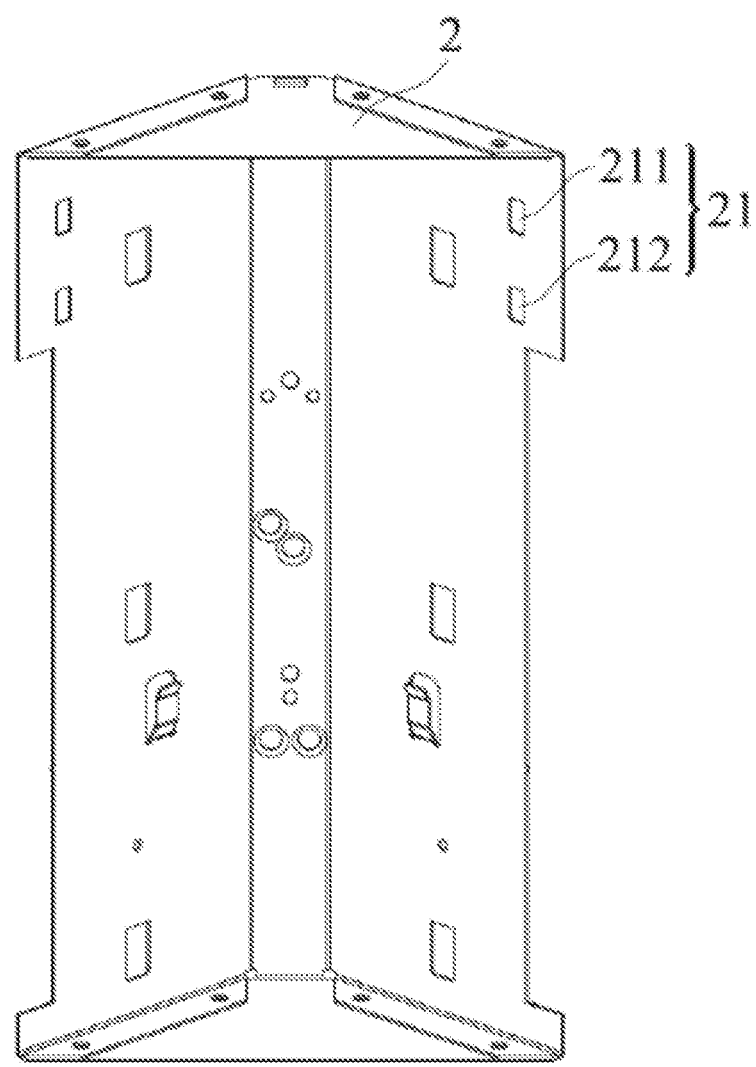
FIG. 2A is a perspective view illustrating a signal reflection structure according to an embodiment of the present invention.
Figure 2B:
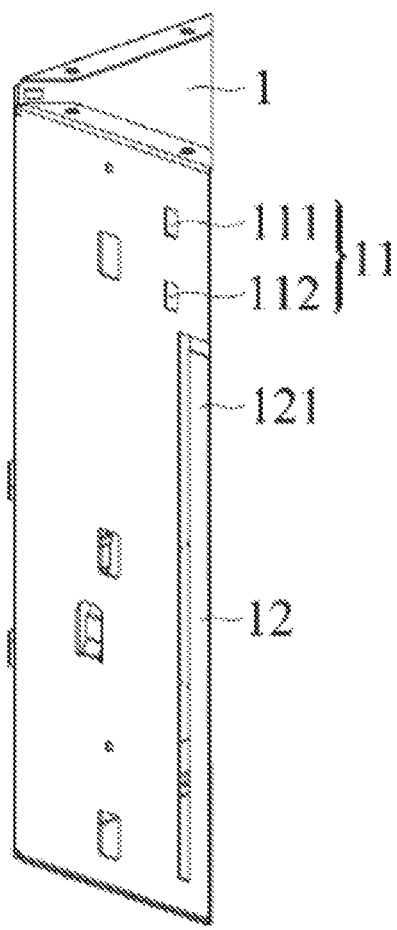
FIG. 2B is a perspective view illustrating a first antenna structure according to an embodiment of the present invention.

FIG. 1 is a perspective view illustrating a part of an antenna A according to an embodiment of the present invention. The antenna A includes a first antenna structure 1, a signal reflection structure 2, and an assembling unit 3. Referring to FIG. 2A and FIG. 2B, the first antenna structure 1 includes a first positioning portion 11, and a radiator 12. The radiator 12 has a free end 121. The signal reflection structure 2 includes a second positioning portion 21, where the signal reflection structure 2 is capable of being assembled with the first antenna structure 1, and the first positioning portion 11 is capable of being aligned to the second positioning portion 21.

Figure 2C:
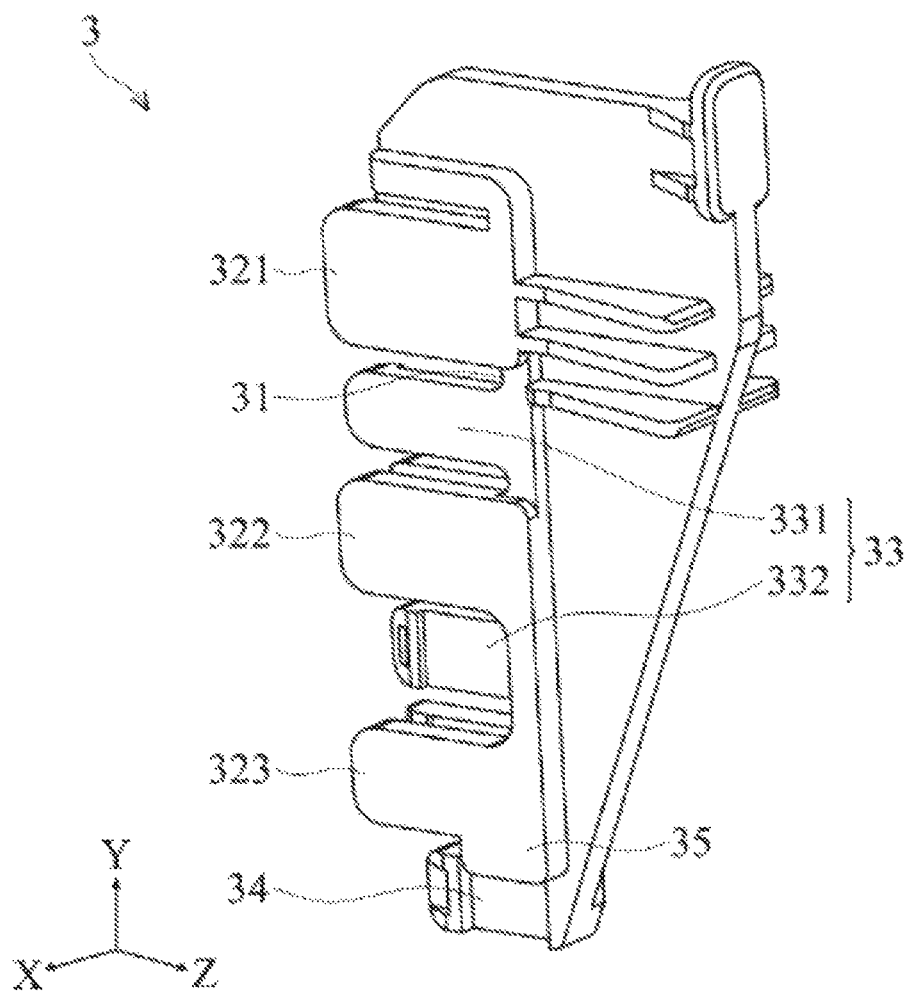
FIG. 2C is a perspective view illustrating an assembling unit according to an embodiment of the present invention.
Figure 2D:
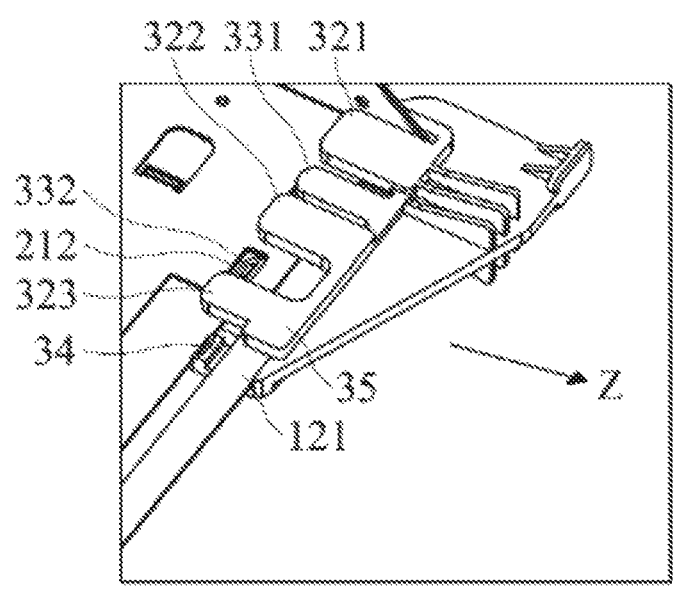
FIG. 2D is a schematic view illustrating the combination of the assembling unit, the first antenna structure, and the signal reflection structure according to an embodiment of the present invention.

Referring to FIG. 1, FIG. 2C, and FIG. 2D, the assembling unit 3 is capable of assembling the first antenna structure 1 to the signal reflection structure 2. The assembling unit 3 includes an inner edge 31, a first clamping part 321, a fastening part 33, and a receiving groove 34. The inner edge 31 is to abut with the first antenna structure 1 and the signal reflection structure 2. The first clamping part 321 is configured to clamp the first antenna structure 1 with the signal reflection structure 2 in order to limit the movement of the first antenna structure 1 and the signal reflection structure 2 in a first axial direction X. The fastening part 33 is capable of fastening the first positioning portion 11 and the second positioning portion 21, thereby limiting the movement of the first antenna structure 1 and the signal reflection structure 2 in a second axial direction Y. The fastening part 33 and the inner edge 31 are to limit the movement of the first antenna structure 1 and the signal reflection structure 2 along a third axial direction Z. The first axial direction X, the second axial direction Y, and the third axial direction Z are perpendicular to each other. The receiving groove 34 is located at an end portion of the assembling unit 3, where the receiving groove 34 is capable of receiving the free end 121 of the radiator 12 in order to limit the movement of the free end 121 in the third axial direction Z.

Referring to FIG. 2A and FIG. 2B, in such embodiment, the first positioning portion 11 includes a first upper slot 111 and a first lower slot 112, the second positioning portion 21 includes a second upper slot 211 and a second lower slot 212. The first upper slot 111 is configured to be aligned with the second upper slot 211, and the first lower slot 112 is configured to be aligned with the second lower slot 212. Referring to FIG. 2C and FIG. 2D, the fastening part 33 includes a first fastener 331 and a second fastener 332. The first fastener 331 is configured to fasten the first upper slot 111 to the second upper slot 211, and the second fastener 332 is configured to fasten the first lower slot 112 to the second lower slot 212.

Referring to FIG. 2C and FIG. 2D, according to an embodiment of the present invention, the assembling unit 3 further includes a second clamping part 322, where the first clamping part 321, the first fastener 331, the second clamping part 322, and the second fastener 332 are arranged sequentially along the second axial direction Y.

According to an embodiment of the present invention, the assembling unit 3 has a blocking section 35 being an extend part of the assembling unit 3, and the blocking section 35 is configured to be partially covering the free end 121 of the radiator 12 in order to limit the displacement of the free end 121 of the radiator 12 in the first axial direction X.

According to an embodiment of the present invention, the assembling unit 3 further includes a third clamping part 323, where the first clamping part 321, the first fastener 331, the second clamping part 322, the second fastener 332, the third clamping part 323, and the blocking section 35 are arranged sequentially along the second axial direction Y, and the blocking section 35 is extended from the third clamping part 323.

By using the assembling unit 3 of the present invention, the first antenna structure 1 and the signal reflection structure 2 can be properly assembled, and the free end 121 of the radiator 12 can be spatially limited thereby preventing deforming or wobbling of the radiator 12.

Figure 3:
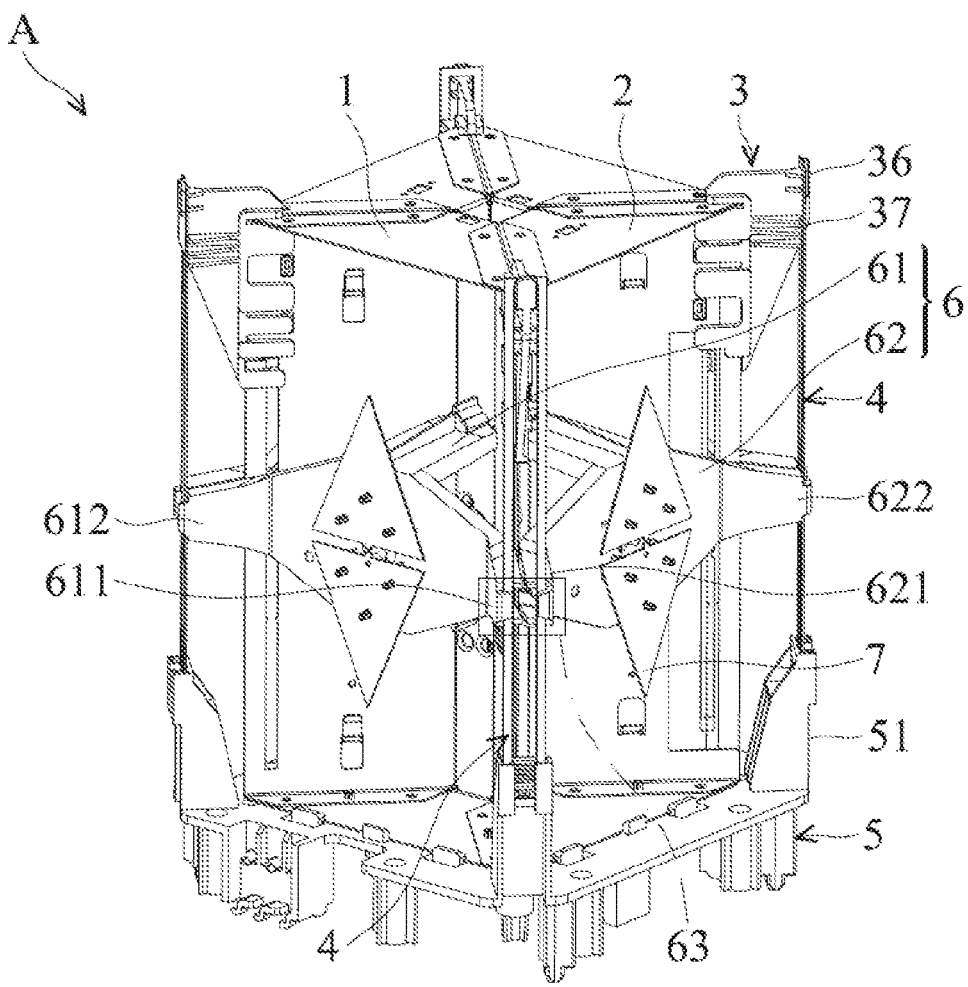
FIG. 3 is a perspective view of the antenna according to an embodiment of the present invention.
Figure 4A:
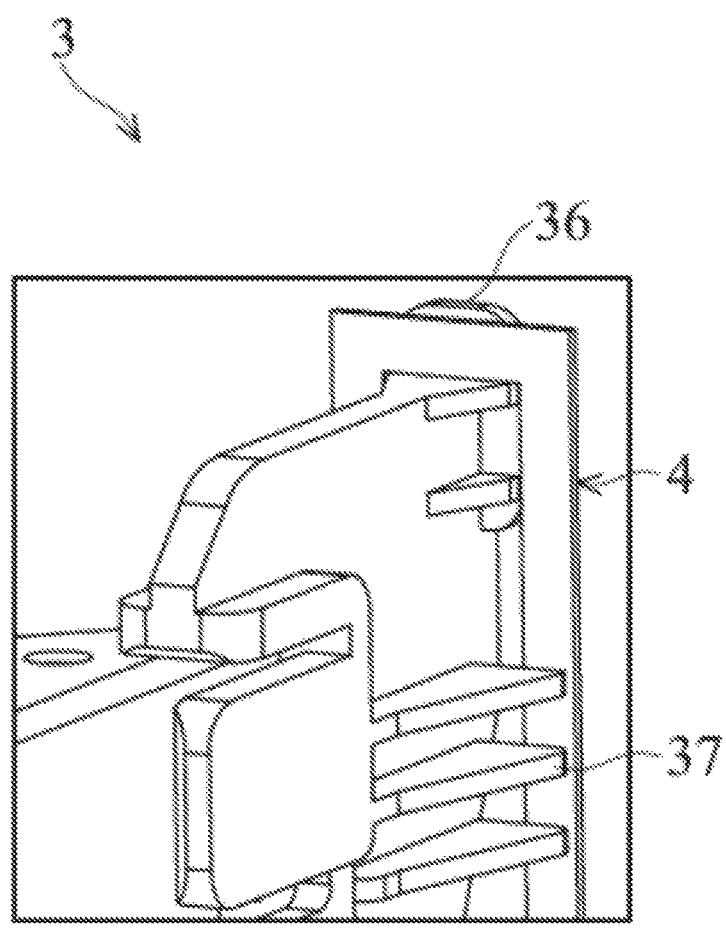
FIG. 4A is a schematic view illustrating the connection of the assembling unit and the gain element according to an embodiment of the present invention.

FIG. 3 is a perspective view illustrating the main structure of the antenna A according to an embodiment of the present invention, in which antenna A further includes a gain element 4, a base 5, and a bend-preventing structure 6. With reference to FIG. 3 and FIG. 4A, an end of the gain element 4 is looped on a first limiting portion 36 of the assembling unit 3 located at a top portion of the first antenna structure 1 and a top portion of the signal reflection structure 2, where the assembling unit 3 is to fix the first antenna structure 1 to the signal reflection structure 2. The first limiting portion 36 is located at the other end portion of the assembling unit 3. Referring to FIG. 3, the base 5 receives a bottom portion of the first antenna structure 1 and a bottom portion of the signal reflection structure 2, in which these bottom portions are opposite to their respective top portions, and located away from the assembling unit 3 assembled at the top portions of the first antenna structure 1 and the signal reflection structure 2. The other end of the gain element 4 is connected to the base 5. The bend-preventing structure 6 includes support structures 61 and 62 that are respectively connected to the first antenna structure 1 and the signal reflection structure 2. The bend-preventing structure 6 is disposed between the assembling unit 3 and the base 5. The bend-preventing structure 6 abuts to the gain element 4.

With reference to FIG. 3, to be more specific, the support structure 61 includes a pair of extend portions 611 and 612 that are substantially symmetrical to each other. Similarly, the support structure 62 includes another pair of extend portions 621 and 622 that are substantially symmetrical to each other as well, where each pair of the extend portions, 611 and 612, 621 and 622, form a U-shape structure. One of the extend portions of the support structure 61 of the first antenna structure 1, for instance the extend portion 611, forms a hook structure 63 with the neighboring extend portion of the support structure 62 of the signal reflection structure 2, in this instance the extend portion 621. In which the hook structure 63 is configured to abut with the gain element 4, and this is how the bend-preventing structure 6 prevents bending and deforming of the gain element 4.

Still referring to FIG. 3, in one of the embodiments, a second antenna structure 7 is also provided and disposed on each of the support structures 61 and 62. Each second antenna structure 7 is disposed between the extend portions 611 and 612, or 621 and 622 of each support structure 61 or 62.

Figure 5A:
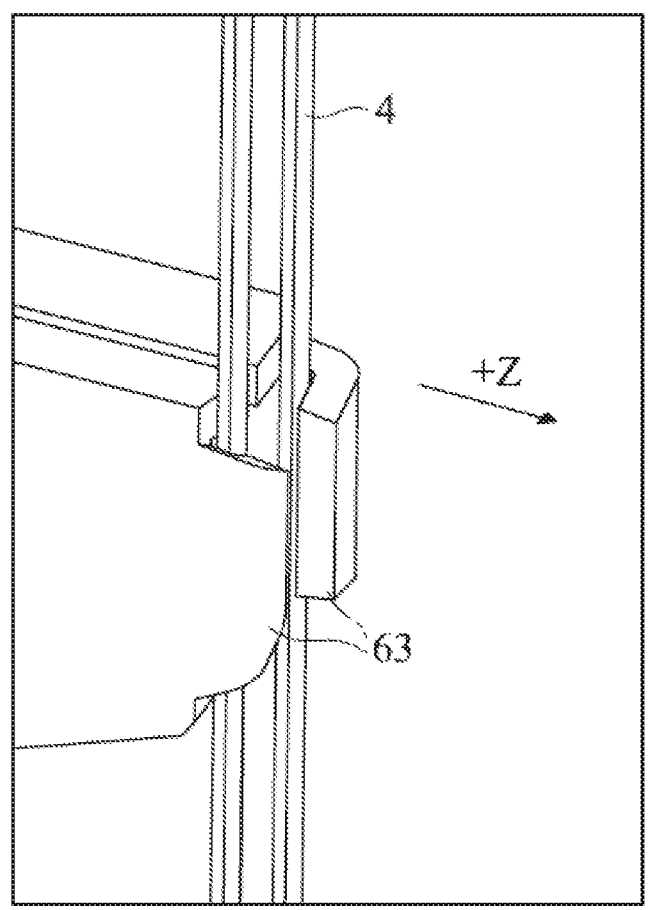
FIG. 5A is a partially enlarged view illustrating the combination of a bend-preventing structure and the gain element according to an embodiment of the present invention.
Figure 5B:
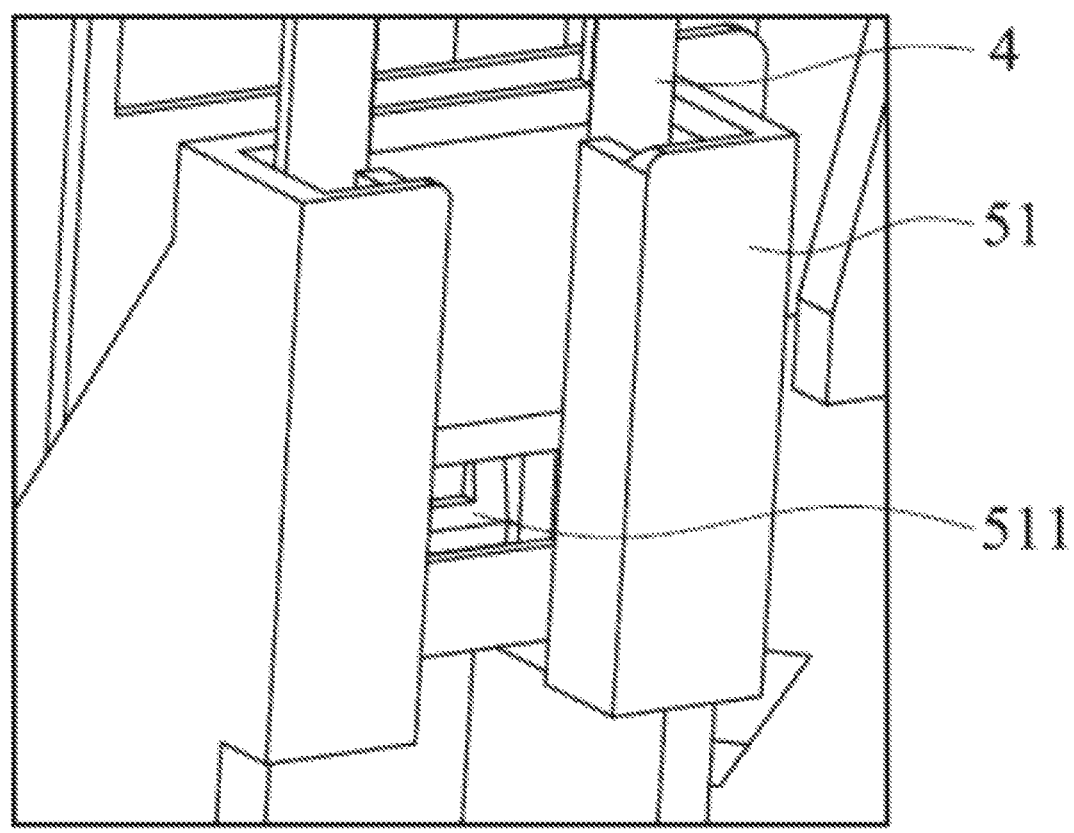
FIG. 5B is a partially enlarged view illustrating the combination of a base and the gain element according to an embodiment of the present invention.

Now refer to FIG. 3 and FIG. 4A, according to an embodiment of the present invention, the assembling unit 3 includes at least one abutting unit 37 abutting on a side of the gain element 4. With reference to FIG. 3 and FIG. 5A, the hook structure 63 of the bend-preventing structure 6 abuts the other side of the gain element 4. As shown in FIG. 3 and FIG. 5B, the base 5 has a second limiting portion 51, which limits the movement of the gain element 4 in conjunction with the first limiting portion 36, especially in the second axial direction Y. Moreover, the combination of the first limiting portion 36, the abutting unit 37, the bend-preventing structure 6, and the second limiting portion 51 prevent bending and deforming of the gain element 4 in the third axial direction Z.

According to the embodiments of the present invention, the gain element 4 can be not only tightly fixed by implementing with the assembling unit 3, the hook structure 63, and the second limiting portion 51, but also properly maintained in shape especially in conjunction with the hook structure 63 of the bend-preventing structure 6.

Note that the coordinate formed of the aforementioned first axial direction X, the second axial direction Y, and the third axial direction Z illustrated in the embodiments above is only for exemplary use, in which the origin of each coordinate is only applicable to a single set of gain element, assembling unit, hook structure, and second limiting portion.

Figure 4B:
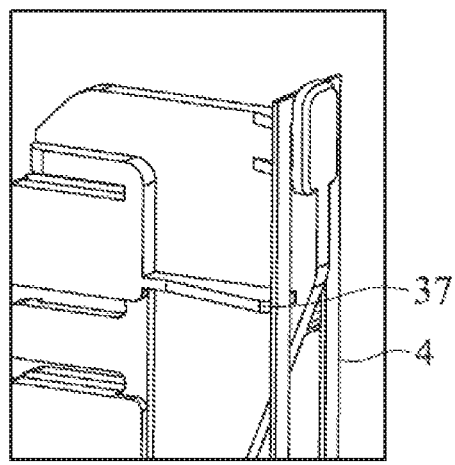
FIG. 4B is a schematic view illustrating another assembling unit connected with the gain element according to an embodiment of the present invention.
Figure 4C:
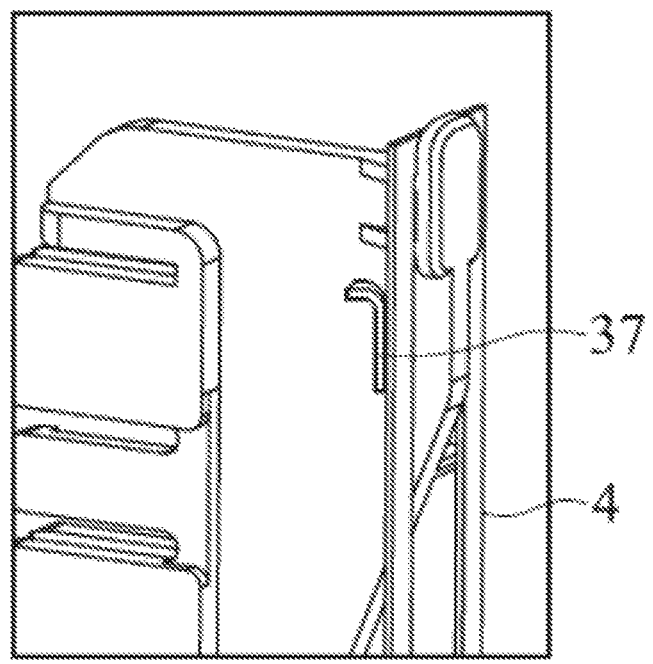
FIG. 4C is a schematic view illustrating still another assembling unit connected with the gain element according to an embodiment of the present invention.

Referring to FIG. 4A, FIG. 4B and FIG. 4C, the abutting unit 37 includes at least one abutting rib. The shape and number of the abutting rib may vary upon different demands.

Figure 5C:
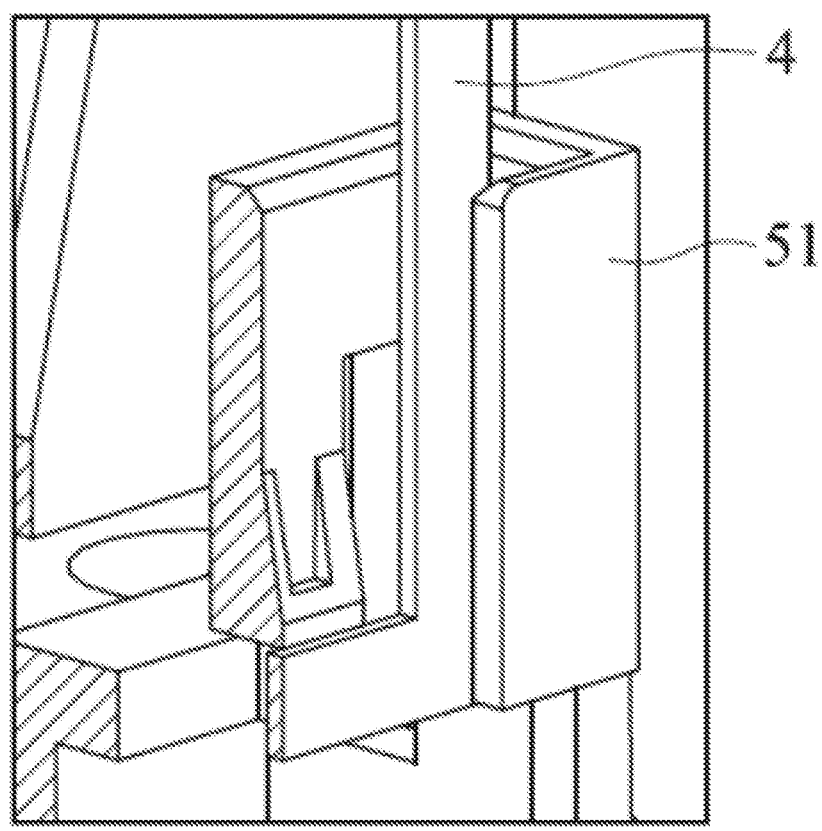
FIG. 5C is a schematic cross-sectional view illustrating a second limiting portion according to an embodiment of the present invention.

As shown in FIG. 5B, the second limiting portion 51 of the base 5 includes a guide projection 511, where the other end of the gain element 4 is connected to the guide projection 511 for limiting movements of the gain element 4. The guide projection 511 can be an elastic cantilever. The cross-section of the second limiting portion 51 may be in a U-shape. Nonetheless, the design of the guide projection and the second limiting portion can be properly adjusted depending on the environment. For instance, the cross-section of the second limiting portion 51 can also be in an L-shape (see FIG. 5C). Furthermore, the gain element 4 is a rectangular loop structure, according to an embodiment of the present invention. In some embodiments, as will be appreciated by persons skilled in the art, the gain element may also be in other geometrical shapes.

Figure 6A:
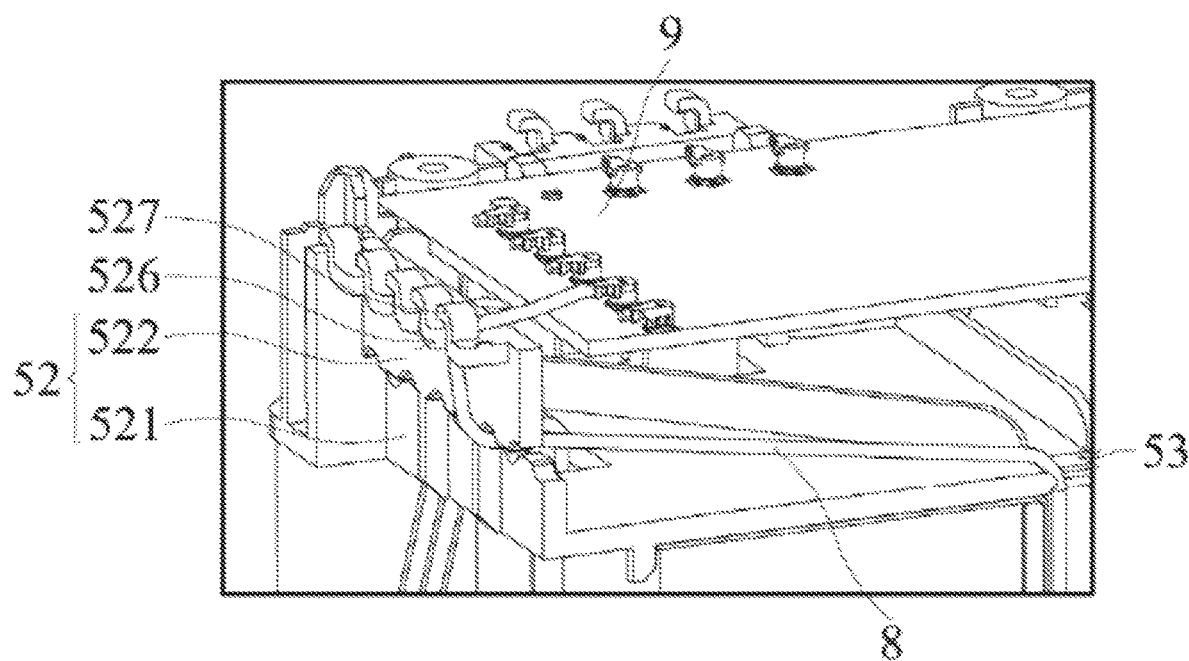
FIG. 6A is a schematic perspective view illustrating the relationship of a transmission line and positioning passages according to an embodiment of the present invention.
Figure 6B:
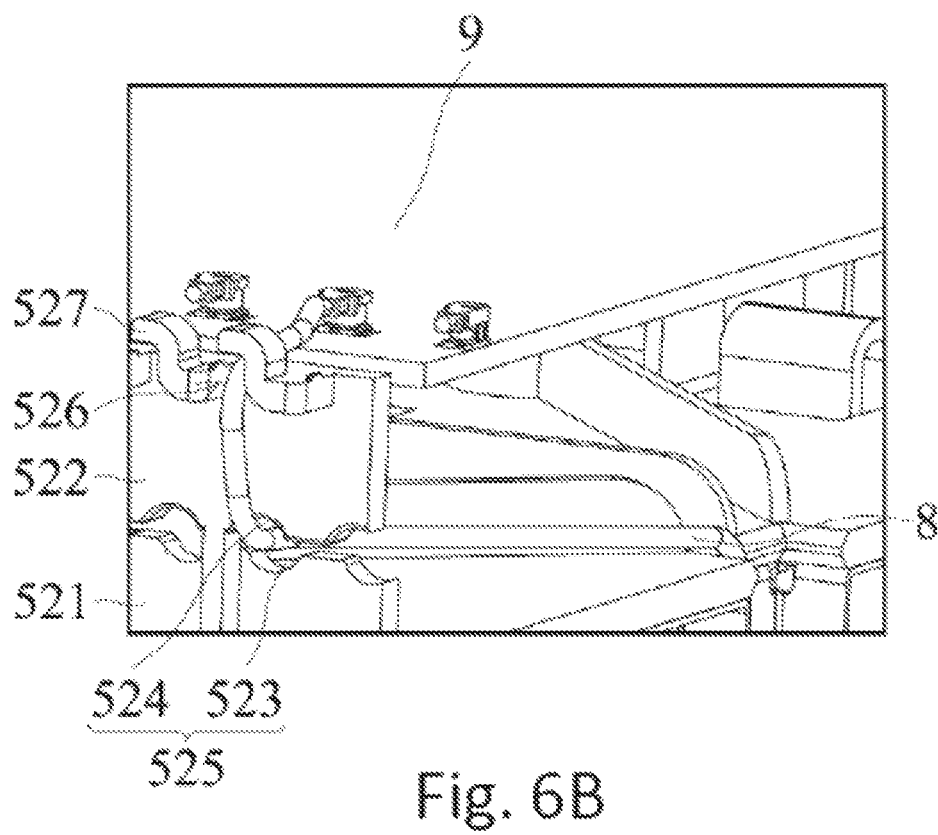
FIG. 6B is a partially enlarged view illustrating the spatial relationship of the transmission line and the positioning passages according to an embodiment of the present invention.

Please refer to FIG. 6A and FIG. 6B, the antenna A of the present invention further includes a transmission line 8 and a circuit board 9. The transmission line 8 is coupled to the first antenna structure 1. The term "coupled" herein means to be "electrically connected". The base 5 has a number of positioning passages 525 formed in one piece, and the transmission line 8 is disposed through one of the positioning passages 525. The circuit board 9 is disposed on the base 5, and the transmission line 8 is coupled to the circuit board 9.

More specifically, the base 5 includes a side wall 52 that has a first side plate 521 and a second side plate 522 located on different planes, the first side plate 521 has a number of first notches 523, the second side plate 522 has a number of second notches 524. Each of the positioning passages 525 are formed of one of the first notches 523 and one of the second notches 524. By implementing this design of which the first side plate 521 having the first notches 523 and the second side plate 522 having the second notches 524 locating on different planes and forming positioning passages 525 can be produced at once during manufacture by using a single set of molds, thereby significantly reducing both tangible and intangible costs.

According to an embodiment of the present invention, the base 5 may also include a central passage 53, where the transmission line 8 first passes through the central passage 53, one of the positioning passages 525, and one of the positioning gaps 526 in sequence, and then connects to the circuit board 9.

The second side plate 522 has a number of limiting tongues 527, the projection of each of the limiting tongues 527 at least partially covers the corresponding positioning gap 526, thereby limiting the movement of the transmission line toward the limiting tongues 527.

Figure 7:
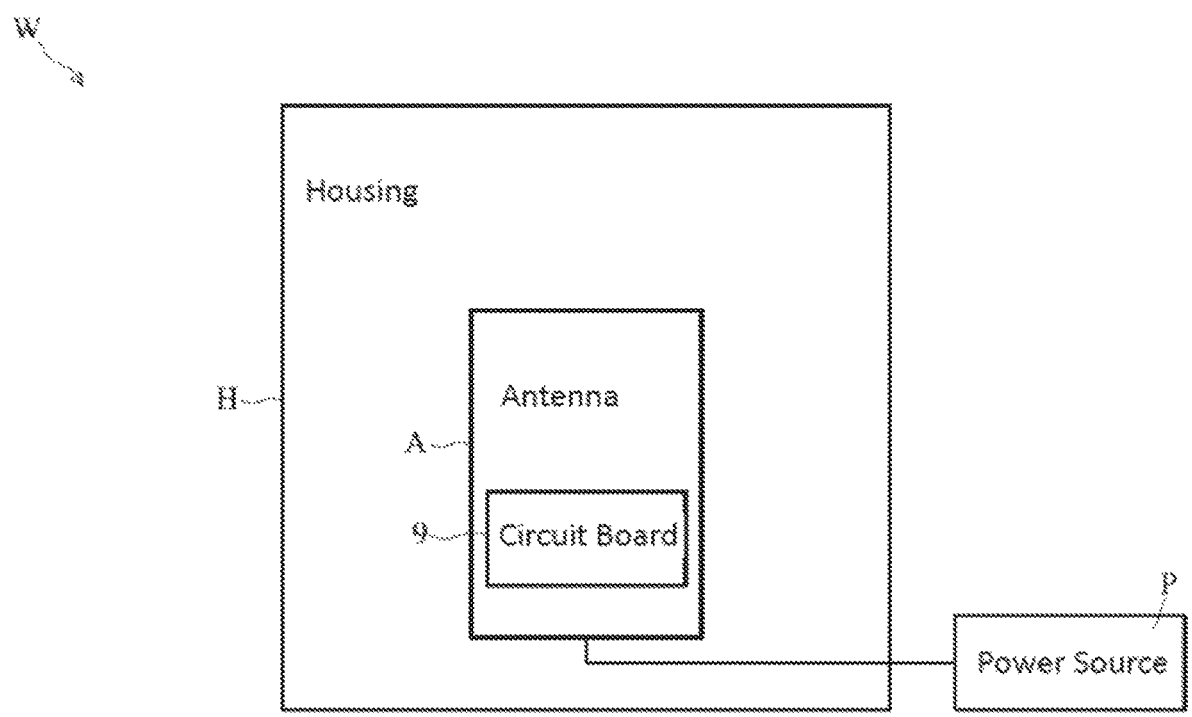
FIG. 7 is a block diagram illustrating a wireless communication device according to an embodiment of the present invention.

Referring to FIG. 7, according to another embodiment of the present invention, a wireless communication device W is provided and includes a housing H and the aforementioned antenna A. The antenna A is disposed inside the housing H, and the antenna A includes a circuit board 9. The circuit board 9 is coupled to the first antenna structure 1 and the signal reflection structure 2 (figure not shown). The circuit board 9 can be electrically connected to a power source P, where the power source P can be an external power source according to an embodiment of the present invention. For instance, the wireless communication device W can be powered via Power-over-Ethernet, POE.

By implementing the design of the aforementioned positioning passages, transmission lines or cables can be properly managed and fixed thereby avoiding wrapping with each others. In addition, because that the positioning passages can be manufactured at the same time, the manufacturing costs can be significantly reduced accordingly.

The description of the invention including its applications and advantages as set forth herein is illustrative and is not intended to limit the scope of the invention, which is set forth in the claims. Variations and modifications of the embodiments disclosed herein are possible, and practical alternatives to and equivalents of the various elements of the embodiments will be understood to those of ordinary skill in the art upon study of this patent document. For example, specific values given herein are illustrative unless identified as being otherwise, and may be varied as a matter of design consideration. Terms such as "target" and "background" and the like are distinguishing terms and are not to be construed to imply an order or a specific part of the whole. These and other variations and modifications of the embodiments disclosed herein, including of the alternatives and equivalents of the various elements of the embodiments, may be made without departing from the scope and spirit of the invention, including the invention as set forth in the following claims.

What is claimed is:

1. An antenna, comprising:
    a first antenna structure, having a first positioning portion and a radiator having a free end;
    a signal reflection structure, having a second positioning portion, wherein the signal reflection structure is configured to be assembled with the first antenna structure, and the first positioning portion corresponds with the second positioning portion;
    an assembling unit for assembling the first antenna structure and the signal reflection structure and having two end portions, wherein the assembling unit comprises:
        an inner edge, configured to abut against the first antenna structure and the signal reflection structure;
        a first clamping part, configured to clamp the first antenna structure and the signal reflection structure for limiting the first antenna structure and the signal reflection structure to move along a first axial direction;
        a fastening part, configured to fasten the first positioning portion and the second positioning portion for limiting the first antenna structure and the signal reflection structure to move along a second axial direction, wherein the fastening part and the inner edge are to limit the movement of the first antenna structure and the signal reflection structure along a third axial direction, wherein the first axial direction, the second axial direction, and the third axial direction are perpendicular to each other; and
        a receiving groove, located at one of the end portions of the assembling unit, wherein the receiving groove is capable of receiving the free end of the radiator in order to limit the movement thereof in the third axial direction.

2. The antenna as claimed in claim 1, wherein the first positioning portion comprises a first upper slot and a first lower slot, and the second positioning portion comprises a second upper slot and a second lower slot, the first upper slot corresponds with the second upper slot, the first lower slot corresponds with the second lower slot, the fastening part comprises a first fastener and a second fastener, wherein the first fastener is capable of fastening the second upper slot, and the second fastener is capable of fastening the first lower slot.

3. The antenna as claimed in claim 2, wherein the assembling unit further comprises a second clamping part, and the first clamping part, the first fastener, the second clamping part, and the second fastener are arranged sequentially along the second axial direction.

4. The antenna as claimed in claim 2, wherein the assembling unit has a blocking section at least partially covering the free end of the radiator for limiting the free end of the radiator to move along the first axial direction.

5. The antenna as claimed in claim 4, wherein the assembling unit further comprises a second clamping part and a third clamping part, the first clamping part, the first fastener, the second clamping part, the second fastener, the third clamping part, and the blocking section are arranged sequentially along the second axial direction, and the blocking section is extended from the third clamping part.

6. The antenna as claimed in claim 1, further comprising:
    a gain element, having an end looped on a first limiting portion located at the other end portion of the assembling unit, wherein the assembling unit is configured to fix a top portion of the first antenna structure to a top portion of the signal reflection structure;
    a base, configured to receive a bottom portion of the first antenna structure that is opposite to the top portion thereof, and a bottom portion of the signal reflection structure that is opposite to the top portion thereof, wherein the other end of the gain element is connected to the base; and
    a bend-preventing structure, configured to be connected to the first antenna structure and the signal reflection structure, wherein the bend-preventing structure is located between the assembling unit and the base, and the bend-preventing structure is configured to abut the gain element.

7. The antenna as claimed in claim 6, wherein the bend-preventing structure comprises two support structures respectively connected to the first antenna structure and the signal reflection structure, each of the support structures has a pair of symmetrical extend portions, the pair of the extend portions of each support structure forms a U-shaped structure, wherein an end of one of the extend portions of the support structure connected to the first antenna structure and an end of one of the extend portions of the support structure connected to the signal reflection structure form a hook structure, the bend-preventing structure abuts the gain element via the hook structure.

8. The antenna as claimed in claim 7, further comprising a second antenna structure disposed between the extend portions of each support structure.

9. The antenna as claimed in claim 6, wherein the assembling unit comprises at least one abutting unit configured to abut on a side of the gain element, the bend-preventing structure is configured to abut on the other side of the gain element, the base comprises a second limiting portion limiting the movement of the gain element in conjunction with the first limiting portion, wherein the combination of the first limiting portion, the abutting unit, the bend-preventing structure, and the second limiting portion prevent bending and deforming of the gain element in the third axial direction.

10. The antenna as claimed in claim 9, wherein the abutting unit includes at least one abutting rib.

11. The antenna as claimed in claim 9, wherein the second limiting portion comprises a guide projection, and the other end of the gain element connects with the guide projection thereby limiting the movement of the gain element in the second axial direction.

12. The antenna as claimed in claim 11, wherein the guide projection is an elastic cantilever.

13. The antenna as claimed in claim 11, wherein a cross-section of the second limiting structure is in an L-shape or U-shape.

14. The antenna as claimed in claim 6, wherein the gain element is a rectangular loop structure.

15. The antenna as claimed in claim 6, further comprising:
a transmission line, coupled to the first antenna structure;
wherein the base has a plurality of positioning passages, the transmission line is disposed through one of the plurality of positioning passages; and
a circuit board, disposed on the base, wherein the transmission line is coupled to the circuit board.

16. The antenna as claimed in claim 15, wherein the base comprising a side wall having a first side plate and a second side plate located on different planes, the first side plate has a plurality of first notches, the second side plate has a plurality of second notches, each of the plurality of positioning passages are formed of one of the first notches and one of the second notches.

17. The antenna as claimed in claim 16, wherein the second side plate has a plurality of positioning gaps, the transmission line is passed through one of the plurality of positioning passages and one of the plurality of positioning gaps.

18. The antenna as claimed in claim 17, wherein the base comprises a central passage, the transmission line is passed through the central passage, one of the plurality of positioning passages, one of the plurality of positioning gaps, and then connects to the circuit board.

19. The antenna as claimed in claim 18, wherein the second side plate has a plurality of limiting tongues, a projection of each of the limiting tongues at least partially covers the corresponding positioning gap, thereby limiting the movement of the transmission line toward the plurality of limiting tongues.

20. A wireless communication device, comprising:
a housing; and
an antenna, disposed in the housing, wherein the antenna comprising:
a first antenna structure, having a first positioning portion and a radiator having a free end;
a signal reflection structure, having a second positioning portion, wherein the signal reflection structure is configured to be assembled with the first antenna structure, and the first positioning portion corresponds with the second positioning portion;
an assembling unit for assembling the first antenna structure and the signal reflection structure and having two end portions, wherein the assembling unit comprises:
an inner edge, configured to abut against the first antenna structure and the signal reflection structure;
a first clamping part, configured to clamp the first antenna structure and the signal reflection structure for limiting the first antenna structure and the signal reflection structure to move along a first axial direction;
a fastening part, configured to fastening the first positioning portion and the second positioning portion for limiting the first antenna structure and the signal reflection structure to move along a second axial direction, wherein the fastening part and the inner edge are to limit the movement of the first antenna structure and the signal reflection structure along a third axial direction, wherein the first axial direction, the second axial direction, and the third axial direction are perpendicular to each other;
a receiving groove, located at one of the end portions of the assembling unit, wherein the receiving groove is capable of receiving the free end of the radiator in order to limit the movement thereof in the third axial direction; and
a circuit board, coupled to the first antenna structure.

* * * * *